United States Patent [19]

Osbourn

[11] Patent Number: 4,607,272
[45] Date of Patent: Aug. 19, 1986

[54] ELECTRO-OPTICAL SLS DEVICES FOR OPERATING AT NEW WAVELENGTH RANGES

[75] Inventor: Gordon C. Osbourn, Albuquerque, N. Mex.

[73] Assignee: The United States of America as represented by the United States Department of Energy, Washington, D.C.

[21] Appl. No.: 539,367

[22] Filed: Oct. 6, 1983

[51] Int. Cl.$^4$ .................... H01L 27/14; H01L 31/00
[52] U.S. Cl. ........................................ 357/30; 357/4; 357/16; 357/61
[58] Field of Search .................... 357/30, 30 A, 30 E, 357/16, 61, 4, 45 L

[56] References Cited

U.S. PATENT DOCUMENTS

| | | | |
|---|---|---|---|
| 3,186,873 | 6/1965 | Dunlap, Jr. | 136/89 |
| 3,478,214 | 11/1969 | Dillman | 250/211 |
| 4,017,332 | 4/1977 | James | 136/89 |
| 4,099,199 | 7/1978 | Wittry | 357/30 |
| 4,128,733 | 12/1978 | Fraas et al. | 136/89 |
| 4,179,702 | 12/1979 | Lamorte | 357/30 |
| 4,206,002 | 6/1980 | Sabnis et al. | 136/89 |
| 4,255,211 | 3/1981 | Fraas | 136/249 |

OTHER PUBLICATIONS

Molecular Beam Epitaxy, by M. B. Panish, Sci., vol. 208, 5/23/80, pp. 916-922.
Heteroepitaxy of $Ge_{1-x}Si_x$ on Si by Transient Heating of Ge-Coated Si Substrates by John C. C. Fan et al, Applied Physics Letters, vol. 37, No. 11, p. 1024.
Material and Device Considerations for Cascade Solar Cells by Salah M. Bedair et al, IEEE Trans PGED, vol. Ed-27, No. 4, Apr. 1980, pp. 822-830.
Limiting Efficiencies of Ideal Single and Multiple Energy Gap Terrestrial Solar Cells by C. H. Henry-Jnl App. Phys., vol. 51, No. 8, Aug. 1980, pp. 4494-4500.
G. C. Osbourn, "Strained-Layer Superlattices from Mismatched Materials", Mar. 1982, *Journal of Applied Physics*, 53(3), pp. 1585-1589.
G. C. Osbourn et al., "A $GaAs_xP_{1-x}$/GaP Strained-Layer Superlattice", Jul. 1982, *Applied Physics Letter*, 41(2), pp. 172-174.

Primary Examiner—James W. Davie
Assistant Examiner—Georgia Y. Epps
Attorney, Agent, or Firm—George H. Libman; Albert Sopp; Judson R. Hightower

[57] ABSTRACT

An intrinsic semiconductor electro-optical device includes a p-n junction intrinsically responsive, when cooled, to electromagnetic radiation in the wavelength range of 8-12 um. The junction consists of a strained-layer superlattice of alternating layers of two different III-V semiconductors having mismatched lattice constants when in bulk form. A first set of layers is either $InAs_{1-x}Sb_x$ (where x is aobut 0.5 to 0.7) or $In_{1-x}Ga_xAs_{1-y}Sb_y$ (where x and y are chosen such that the bulk bandgap of the resulting layer is about the same as the minimum bandgap in the $In_{1-x}Ga_xAs_{1-y}Sb_y$ family). The second set of layers has a lattice constant larger than the lattice constant of the layers in the first set.

12 Claims, 3 Drawing Figures

ELECTRO-OPTICAL SLS DEVICES FOR OPERATING AT NEW WAVELENGTH RANGES

The U.S. Government has rights in this invention pursuant to Contract No. DE-AC04-76DP00789 between the U.S. Department of Energy and Western Electric Company.

CROSS REFERENCE TO RELATED APPLICATIONS

This application is related to U.S. Ser. No. 512,059, filed on July 8, 1983, whose disclosures are incorporated by reference herein.

BACKGROUND OF THE INVENTION

There are several applications, including military ones, associated with infrared imaging in the 3-5 μm and 8-12 μm wavelength ranges (where atmospheric absorption is minimal). These have motivated substantial research efforts to develop intrinsic semiconductor detectors capable of operation at these wavelengths. Intrinsic detectors are those wherein absorption is based on excitation of carriers from valence bands to conduction bands. Although a number of materials appear suitable for fabricating imaging arrays for the 3-5 μm range, no bulk III-V materials have bandgap values small enough for cooled (e.g., 77° K.) (low noise) detector operation in the important 8-12 μm range. As a result, it has been necessary to consider a number of II-VI and IV-VI materials as potential candidates for 8-12 μm applications.

Most of the research on these applications in recent years has concentrated on the II-VI alloy $Hg_{1-x}Cd_xTe$. This alloy has a range of bandgaps (at 0° K.) which extends from $Eg \sim 1.6$ eV (x=1.0) to Eg=0.0 eV (x~0.16), and the alloy with x=0.205 has the required bandgap for 77° K. detector operation in the 8-12 μm atmospheric window. See, e.g., *Semiconductors and Semimetals*, Willardson and Beer, Ed, Vol. 18, "Mercury Cadmium Telluride", Academic Press (1981). However, the HgCdTe alloys which are Hg rich have a number of metallurgical and device related problems which will make satisfactory 8-12 μm imaging arrays in these materials difficult if not impossible to achieve. Some of these problems are listed below:

(1) HgCdTe is mechanically brittle.
(2) The hole concentrations in p-type HgCdTe are difficult to control; n-type "doping" is typically produced by unannealed implantation damage.
(3) Above ~100° C., Hg outdiffusion becomes a problem (causing n-type material to convert to p-type). This suggests long term stability problems, and eliminates the possibility of high temperature device processing of HgCdTe wafers.
(4) The $Hg_{1-x}Cd_xTe$ bandgap and the associated IR detector cutoff wavelength vary rapidly with alloy composition. As a result, the composition must be held to within about ±0.3% across the entire wafer to avoid large, lateral non-uniformities in detector performance (i.e., poor device yield).
(5) The extremely small electron effective mass ($m_e^*$) in the Hg rich alloys causes (conduction) band to (valence) band tunneling to be significant. This causes an experimentally observed noise component that cannot be reduced by cooling the detector. In addition, tunneling reduces the photodiode dynamic resistance at zero bias ($R_o$) defined by $R_o^{-1} \equiv (dI/dV)|_{v=o}$. This may prevent the successful operation of 8-12 μm detector arrays which make use of charge-coupled device (CCD) readouts, since CCD's need a certain minimum $R_o$.

SUMMARY OF THE INVENTION

Accordingly, it is an object of this invention to provide new electro-optical devices, capable of operating at new wavelength ranges, e.g., 8-12 μm, heretofore not usable in conjunction with the particular semiconductor materials used in the devices.

It is another object of this invention to provide such new devices which avoid or ameliorate the disadvantages of the prior art, including those mentioned above for HgCdTe devices.

It is a further object of this invention to achieve these results based on the effects of strained-layer superlattices (SLS).

Upon further study of the specification and appended claims, further objects and advantages of this invention will become apparent to those skilled in the art.

These objects have been achieved by this invention by providing an intrinsic semiconductor electro-optical device comprising a p-n junction intrinsically responsive, when cooled, to electromagnetic radiation in the wavelength of 8-12 μm and which consists essentially of semiconductor materials of the III-V family, wherein said radiation responsive p-n junction comprises a strained-layer superlattice (SLS) of alternating layers of two different III-V semiconductors, the lattice constants of the two semiconductors when in bulk form being mismatched whereby a total strain is imposed on each pair of alternating semiconductor layers in the SLS structure, the proportion of the total strain which acts on each layer of the pair being inversely proportional to the ratio of the layer thicknesses of each layer in the pair, a first set of said alternating III-V semiconductor layers being $InAs_{1-x}Sb_x$ wherein x is about 0.5-0.7, and the second set of said alternating layers comprising a III-V semiconductor having a lattice constant larger than the lattice constant of the layers in the first set, the strain resulting from the mismatch of lattice constants and said ratio of layer thicknesses being effective to narrow the bandgaps of said first set of III-V layers, thereby changing the intrinsic radiation absorption characteristics of said layers when cooled to include wavelengths in the 8-12 μm region which are larger than those to which said individual layers would be responsive when cooled and in bulk form.

BRIEF DESCRIPTION OF THE DRAWINGS

Various other objects, features and attendant advantages of the present invention will be more fully appreciated as the same becomes better understood when considered in conjunction with the accompanying drawings, and wherein.

DETAILED DISCUSSION

Figure 1:
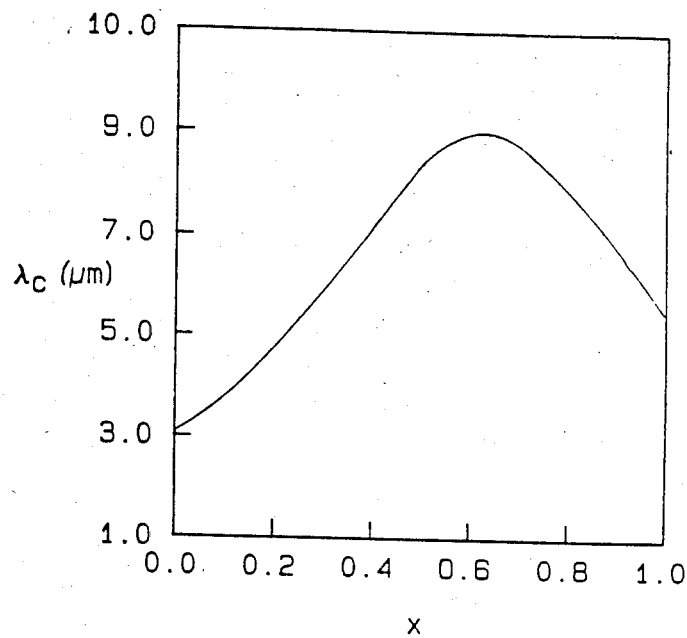
FIG. 1 shows the wavelength cutoff of bulk $InAs_{1-x}Sb_x$ at 77° K. as a function of x.

SLS systems comprise a sequence of thin layers of at least two different semiconductor materials which in bulk have lattice constants which differ from one another. The effect of this lattice mismatch in the SLS system is to force the two adjoining lattices to align under a strain caused by the forced alignment. Under conditions which are well known, including satisfaction of a maximum mismatch degree (around 7–8% differences in lattice constants) and adequately thin layer thicknesses (e.g., generally less than about 500 Å), layer-to-layer lattice defects (e.g. misfit dislocations) are suppressed as energetically unfavorable. In addition, the structures act as barriers to dislocation propagation from underlying layers, e.g., graded layers. As a result, a much higher crystal lattice integrity is attained in each layer and overall than would otherwise be possible were two adjacent layers grown in bulk. Hence, SLS structures are often employed when it is desired to grow adjoining layers having different lattice constants. Throughout the following, "SLS" refers to a structure having the necessary layer properties to avoid and/or minimize misfit dislocations as described above and in the literature.

The inherent strain in the SLS systems, while being necessary to suppress the disadvantageous lattice defects, also disturbs other system properties. For example, such strains are known to cause changes in the effective bandgaps of each of the layers. Thus, the influence of one layer on the adjoining layer might cause an increase in bandgap while the effect of the latter on the first layer would cause a decrease in its bandgap. In prior art applications, the effects were simply unavoidable characteristics which had to be tolerated. It has now been discovered that these effects can be put to advantage in an electro-optical device to cause semiconductor materials to be responsive to wavelengths to which they would be unresponsive in bulk form.

Normally, III–V semiconductor alloys cannot operate in the important 8–12 $\mu$m wavelength range at low temperatures such as 77° K. which are required for high S/N ratios. For example, in FIG. 1 there is shown the dependence of $\lambda_c(\mu m)$, i.e., the wavelength cutoff for $\lambda_c \equiv 1.24/E_g$, where $E_g$ is the bandgap, of bulk $InAs_{1-x}Sb_x$ at 77° K. as a function of x. As can be seen, at a value of x of approximately 0.61, the longest wavelength response is slightly higher than 9.0 $\mu$m but is insufficient for the desired applications up to 12 $\mu$m.

By using alternating layers of two different InAsSb alloys combined in a SLS, the overall wavelength response of the SLS can be extended to higher wavelengths as desired. This is accomplished by appropriately selecting the two alloys such that the mismatch strain on one causes a decrease in its bandgap whereby it can be used as an intrinsic detector of longer wavelength radiation corresponding to the narrower gap. In general, mismatching a given layer with another having a larger lattice constant will tend to stretch the usual lattice configuration of the first layer in the planes parallel to the interfaces, causing a decrease in bandgap. A mismatch with a layer having a smaller lattice constant than the layer of interest will cause a squeezing effect in the planes parallel to the interfaces, increasing the bandgap and hence decreasing the cutoff wavelength. These effects per se are known as is the magnitude of the bandgap variation as a function of the degree of mismatch. Hence for a desired variation in bandgap, using conventional knowledge the degree of mismatch required can be readily and reliably calculated. Precise mismatches and bandgap variations can be routinely determined in accordance with conventional experimental procedures based on the original calculated estimations.

In general, within the family of III–V direct gap compound semiconductors for a given lattice mismatch, the bandgap variation will be about the same for all members. Hence the largest relative variations in response will occur for those semiconductor materials having relatively small bandgaps in bulk. It is for this reason, inter alia, that the InAsSb system is preferred. It is a III–V material with a relatively small bandgap in bulk. However, of course, the invention is still applicable to the materials having relatively large bulk bandgaps.

Another primary consideration is the inherent limitation in the degree of mismatch which can be tolerated while still achieving an effective SLS. Normally, for mismatches greater than 7–8% in lattice constant, unacceptable crystal defects, e.g., dislocations crossing layers, will occur due to the large strains. The mismatch degree must be small enough to provide an effective SLS system.

Having determined the magnitude of the lattice mismatch required to provide the desired bandgap variation $\Delta E_g$, the thickness ratio must also be considered. The effect of the lattice mismatch, of course, is to cause a strain in each of the two layers involved, in one case causing a gap narrowing and in the other case a gap broadening. The degree of these individual effects will be determined by the ratio of the two layer thicknesses and the elastic constants of the two layers in accordance with well known functional dependences. See, e.g., Osbourn, J. Vac. Sci. Technol. Bl(2), April-June 1983, interalia, whose entire disclosures are incorporated by reference herein. Hence, for a thickness ratio of 1/1, for materials with essentially equal elastic constants, equal strains due to the lattice constant mismatch will be exerted on each of the two layers. For a 2/1 thickness ratio, the thinner layer will have approximately twice the strain as the thicker layer. Thickness ratio thus becomes a design parameter providing another degree of freedom for achieving the proper strain level to achieve the desired $\Delta E_g$. In conjunction with the mismatch per se, it facilitates the fine tuning of the device design. Typically, thickness ratios will be in the range of 10/1–1/10.

Once lattice constant mismatches and thickness ratios are chosen or, preferably, once combinations of these two are chosen, actual layer thicknesses will be selected again using fully conventional considerations in conjunction with the guidelines provided herein. From the point of view of the SLS effect alone, it will only be necessary that the layers be sufficiently thin that the induced strains suppress misfit dislocations. Typically, layer thicknesses will be in the range of 30–500 or 50–500 Å, the lower figures being determined primarily by growth technology.

However, SLS effects are not the only consideration. It is also known that at the small layer thicknesses involved in a SLS, certain quantum mechanical effects will occur. See, e.g., Osbourn, supra. In fact, highly advantageous photovoltaic devices have been suggested based upon such quantum effects in combination with a SLS structure. See, e.g., U.S. patent application Ser. No. 512,059 filed on July 8, 1983, entitled Quantum Well Multi-Junction Photovoltaic Cell, whose entire disclosure is also incorporated by reference herein. Since a complete description of the quantum mechanical phenomena is contained in the foregoing references, the effect will only be outlined here for purposes of clarity.

In essence, the alternating layers of different semiconductor materials, over and above the effect of the mismatch strain, cause a quantum mechanical perturbation of bandgap energy levels such that the overall structure has an effective bandgap which is larger when this quantum mechanical effect is more effective. This is due to the formation of quantum wells which have been characterized as derived from high potential barriers formed by the alternating material of higher bandgap surrounding the alternating layers of lower band-gap.

As can be seen under appropriate circumstances, it is possible for the quantum well effect to be opposed to the desired effect based on the mismatch strain. For example, in the III–V systems discussed above, it is desired to narrow the bandgap of the material having the lowest bulk bandgap to provide responsivity at longer wavelengths. The described SLS has a series of alternating layers of low bandgap material and high bandgap material. The net effect of mismatch strain is to further lower the bandgap of the lowest material. However, as described above, the quantum mechanical effect is to provide an increase in the effective SLS bandgap.

Fortunately, selection of absolute thicknesses of the SLS layers can be used to suppress the quantum well effect to a degree that the mismatch effect greatly predominates. In this regard, reference is made to the full disclosure in U.S. Serial No. 512,059, cited above, most notably to FIG. 1. As the thickness of the "quantum well layers", i.e., the layers of the lower bandgap, is increased, there is a very rapid decrease in quantum well energy, i.e., the system more closely approaches the bulk situation and only the lowest levels of the quantum wells are occupied. Fortunately, thicknesses which minimize the quantum well effects are well within the range at which SLS effects can still be achieved, e.g., greater than about 100 or 200 Å.

Hence, where quantum well effects are opposed to those to be achieved using the mismatch strain, layer thicknesses will be somewhat larger than they otherwise might be. In general, where quantum well effects are to be minimized, the highest thicknesses will be employed which are still compatible with the achievement of a SLS system, i.e., with the maximum thickness which can be employed at a given strain for a given composition.

As can be seen, once the basic inventive concept of the device is in hand, in accordance with the description given herein and readily available conventional information, precise details of the mismatch strains, thickness ratios, layer thicknesses per se, semiconductor compositions corresponding to desired lattice constants, etc., can all be readily calculated and determined in order to provide a system having a response different from that of each of the individual semiconductor materials in bulk. These a priori calculations provide highly reliable guidance such that only routine conventional experimental, parametric experiments (e.g., using conventional semiconductor measurement systems) need be performed in order to finalize and optimize the details of a device's structure in a given case. The functional dependencies and basic data for performing the mentioned calculations are well known and conventionally applicable to this invention. See, e.g., Osbourn, J. Vac. Sci. Technol. Bl(2), April-June 1983, p. 379; Gourley et al, ibid, p. 383; *Semiconductors and Semimetals,* Willardson et al, ed., Vol. 4, "Physics of III–V Compounds," Academic Press (1968), all pages, especially 327–330; R. Dingle, Crit. Rev. Solid State Sci., Vol. 5, p. 585 (1975); L. Esaki et al, Crit. Rev. Solid State, Vol. 6 (1976); M. B. Panish, Science, Vol. 208, p. 916 (1980); A. Madhukar, J. Vac. Sci. Technol., Vol. 20, p. 149 (1982); G. C. Osbourn J. Appl. Phys., Vol. 53, p. 1586 (1982); G. C. Osbourn et al, Appl. Phys. lett., Vol 41, p. 172 (1982); J. W. Matthews et al, J. Cryst. Growth, Vol. 27, p. 118 (1974); J. W. Matthews et al, ibid., Vol. 29, p. 273 (1975); J. W. Matthews et al, ibid., Vol. 32, p. 265 (1976); G. C. Osbourn, J. Vac. Sci. Technol., Vol. 21, p. 469 (1982); R. Dingle et al, Phys. Rev. Lett., Vol. 33, p. 827 (1974); S. R. White et al, Phys. Rev. Lett., Vol. 47, p. 879 (1981); G. Bastard, Phys. Rev., Vol. B 25, p. 7584(1982) I. J. Fritz et al., Solid State Commun., Vol. 45, p. 323 (1983); I. J. Fritz et al, "Proceedings of 1982 Int. Symposium on GaAs and Related Compounds", (Institute of Physics, Berkshire, 1983), p. 241; and G. H. Dohler, Jr. Vac. Sci. Technol., Vol. 16, p. 851 (1979); all of whose entire disclosures are incorporated by reference herein.

The second layer to be employed in conjunction with a first primary layer will generally not be critical. The major requirement is that the second layer have the necessary lattice constant providing the necessary mismatch strain and that it provide a SLS structure when grown in conjunction with the primary layers at the necessary thicknesses. For example, in the following, the second layer and the first layer are both from the InAsSb family. However, other candidates semiconductor layers also exist which have the necessary lattice parameters, most notably others in the III–V genus.

From the foregoing, it will be realized that both of the layers in the SLS will have changed bandgap energies. The system will be designed primarily in view of a given change for one set of the layers. Under most circumstances, the change in the other set of layers will be fully compatible with intended device operation and there will be no difficulty. For example, in the III–V system where longer cutoff wavelengths are to be obtained, the fact that the secondary set of alternating layers will have decreased cutoff wavelengths will not be of consequence since the overall system will respond at the longer wavelengths which is the primary aim. However, in situations where the two effects might be counterproductive, the thickness ratio parameter discussed above can be used to maximize the magnitude of the desired effect and minimize the magnitude of the undesired effect.

Device fabrication is entirely routine and conventional given the details disclosed herein. Any conventional method for growing the semiconductor layers in the necessary thicknesses can be used. Epitaxial methods will be employed, most preferably molecular beam epitaxy. See, e.g., U.S. Ser. No. 512,059, cited above.

In general, the dimensions of the devices of this invention and the number of layers employed in the SLS structures will be determined conventionally, primarily from a consideration of the likely incident intensities and a desire to have the device be capable of absorbing all of the incident radiation, thereby enhancing device sensitivity. Again, see U.S. Ser. No. 512,059.

Figure 2:
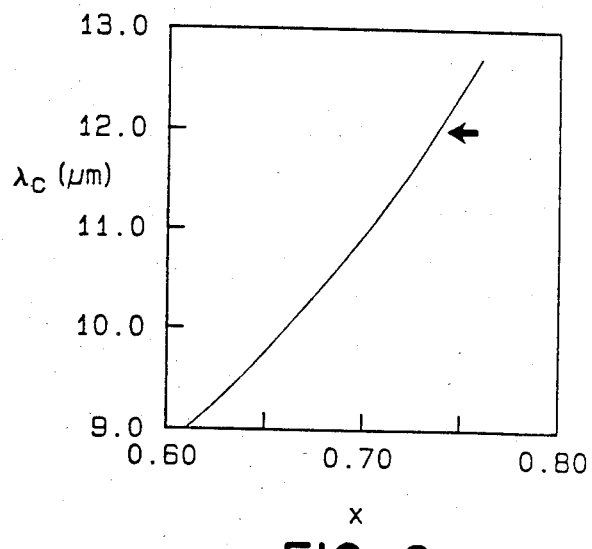
FIG. 2 shows the wavelength cutoff at 77° K. of the bulk, strained $InAs_{0.39}Sb_{0.61}$ layer in an $InAs_{0.39}Sb_{0.61}$/$InAs_{1-x}Sb$. SLS as a function of x>0.61.

As mentioned above, because of their desirable properties, it is preferred that the device of this invention comprise III–V semiconductor materials. It is further preferred that materials of relatively low bandgap be employed so that the effect of increasing cutoff wavelength will be relatively major. In this regard, InGaAsSb is preferred, most preferably InAsSb. In these systems, changes in bandgap size of 40–50% can be achieved since the gaps are relatively small, e.g., around 0.1–0.2 ev. FIG. 2 shows the wavelength cutoffs which can be achieved at 77° K. for a system based on bulk strained $InAs_{0.39}Sb_{0.61}$ layers in a $InAs_{0.39}Sb_{0.61}/InAs_{1-x}Sb_x$ strained-layer superlattice as a function of $x>0.61$. The value of $x=0.61$ is based on the fact that this composition has the lowest bulk bandgap as shown in FIG. 1. Hence, a smaller strain is needed to achieve a 12 μm response than for the other compositions depicted in FIG. 1.

As can be seen in FIG. 2, for a value of x of about 0.73, the cut-off wavelength reaches a value of 12 μm as desired. At values equal to or greater than 0.73, the bulk bandgap of the $InAs_{0.39}Sb_{0.61}$ layers is reduced to a value below 0.1 ev. FIG. 2 is based on a lattice mismatch of the two SLS layers of 0.86% for the case of $x=0.73$, i.e., a $\lambda_c$ of 12 μm. The data in FIG. 2 is for a thickness ratio of 1.0. Because of the necessity of minimizing quantum well effects for the reasons discussed above, actual layer thicknesses will be in the range of 100–300 Å for the $InAs_{0.27}Sb_{0.73}$ layers and hence also in the same range for $InAs_{0.39}Sb_{0.61}$ if it is desired to employ a thickness ratio of 1.0. The amount of strain in the $InAs_{0.39}Sb_{0.61}$ layers caused by the secondary layers wherein $x=0.73$ to achieve 12 μm detector response is $\Delta a/a \sim 0.4\%$. This is well within the range of strains which have been experimentally employed in two previous SLS material systems; see G. C. Osbo urn et al, Appl. Phys. Lett., Vol. 41, p. 172 (1982); and I. J. Fritz et al, "Gallium Arsenide and Related Compounds", 1982, Inst. Phys. Conf. Ser., Vol. 65, p. 241 (1983), whose disclosures are incorporated by reference herein.

Similar details are routinely determinable for InGaSb systems using the foregoing as a guide.

The new devices of this invention are advantageous from many points of view in addition to the basic feature of providing wavelength response in regions heretofore unavailable using certain materials. Thus, in addition to extending the wavelength cutoff of materials such as InAsSb alloys to the range of interest, the III–V InAsSb SLS materials of this invention also avoid the types of problems listed above for HgCdTe. In particular, problems 1–3 are avoided simply because III–V materials are used. Problem 4 is eliminated because of the slow dependence of the InAsSb SLS cutoff wavelength on composition as shown in FIG. 2 (dEg/dx<4 meV/percent). Readily achievable, lateral compositional variations of 1.5% can be tolerated across an InAsSb SLS wafer because of this slow dependence. The solution to problem 5 is based on the inherent capability of these devices to increase the effective mass of superlattice carriers along the direction perpendicular to the superlattice layers. Although it is generally known that this increase affects conventional superlattice transport mechanisms in the perpendicular direction, it has recently been realized that this increase will also reduce conduction band to valence band tunneling in reverse-biased superlattice diode structures. See, e.g., D. L. Smith et al, Appl. Phys. Lett., Vol. 43, p. 180 (1983), whose disclosures are incorporated by reference herein. This property alone provides a strong motivation for using superlattice materials rather than bulk materials for device applications requiring very small bandgaps.

Figure 3:
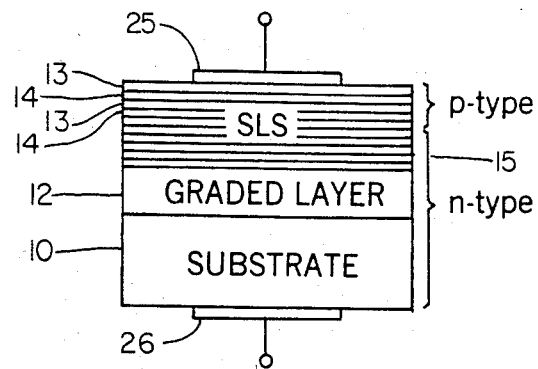
FIG. 3 illustrates one configuration of a device of this invention.

The devices of this invention can be used in all configurations for which analogous devices of the prior art, e.g., p-n junction-based intrinsic detectors, have been used. One such device is shown in FIG. 3. It comprises a conventional substrate 10 such as InSb, e.g., p-type. SLS structure 15 consists of alternating III–V layers 13, 14 of semiconductor material as discussed above. In situations where the lattice constant of the SLS layers is sufficiently different from that of the substrate 10 to cause a significant likelihood that unacceptable lattice defects will occur, conventional graded layers 12 can be interposed between the SLS and the substrate such as that shown in FIG. 3. For example, for a SLS of $InAs_{0.39}Sb_{0.61}/InAs_{0.27}Sb_{0.73}$, one preferred such layer would be a $InAs_{1-x}Sb_x$ graded layer, with x typically being 1.0–0.67, n-type in the illustrated configuration. Where the SLS lattice constants are fairly well matched with that of the substrate, the graded layer can be omitted, as is well known for conventional devices. Of course, the n-n-n-p stucture is only one of the many possible configurations which are possible, as again is well known to those skilled in the art.

The invention further includes conventional electrical contacts 25, 26 operably connected to the p-n junction in order that the electrical output of the device may be detected and utilized.

Generally, the devices of this invention will be made to operate at low temperatures such as 77° K. in order to provide maximum S/N ratios by noise reduction. However, room temperature devices are also fully within the scope of this invention. Similarly, where advantageous for a given application, multijunction devices can be fabricated employing two or more SLS systems of this invention. Where the additive effects of the various junctions are desired, conventional tunnel junctions will be employed as intermediate shorting interconnections. However, it is also possible that two SLS systems of this invention might be employed where it is desired to isolate a relatively narrow portion of the increased response range. This can be accomplished by stacking two SLS's of this invention. The topmost system will absorb the undesired radiation, only the radiation of the wavelengths of interest falling upon the underlying SLS. Only the latter SLS will be by provided with conventional electrical contacts; hence, current will be proportional to its response only.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. An intrinsic semiconductor electro-optical device comprising a pair of spaced electrodes operably connected to a p-n junction intrinsically responsive, when cooled, to electromagnetic radiation in the wavelength range of 8–12 μm and which consists of semiconductor materials of the III–V family, wherein said radiation responsive p-n junction comprises a strained-layer superlattice (SLS) of alternating layers of two different III–V semiconductors, said two semiconductors when in bulk form having mismatched lattice constants, whereby a total strain is imposed on each pair of alternating semiconductor layers in said SLS structure, the proportion of the total strain which acts on each layer of said pair being inversely proportional to the ratio of the layer thicknesses of each layer in the pair, a first of said alternating III-V semiconductor layers being $InAs_{1-x}Sb_x$ wherein x is about 0.5-0.7, and the second of said alternating layers comprising a III-V semiconductor having a lattice constant larger that the lattice constant of said first layers, the strain resulting from the mismatch of lattice constants and said ratio of layer thicknesses being effective to narrow the bandgaps of said first of III-V layers, thereby changing the intrinsic radiation absorportion characteristics of said layers when cooled to include wavelengths in the 8-12 μm region which are larger than those to which said individual layers would be responsive, when cooled and in bulk form.

2. A semiconductor electro-optical device of claim 1, wherein said p-n junction is responsive to electromagnetic radiation of a wavelength of 12 μm.

3. A semiconductor electro-optical device of claim 1, wherein said second of said alternating layers consists essentially of $InAs_{1-y}Sb_y$ wherein y is greater than about 0.65.

4. A semiconductor electro-optical device of claim 2, wherein said second of said alternating layers consists essentially of $InAs_{1-y}Sb_y$ wherein y is greater than about 0.73, and x in said first of said layers is about 0.61.

5. A semiconductor electro-optical device of claim 3, wherein said layer thicknesses in said SLS are in the range of about 30-500 Å.

6. A semiconductor electro-optical device of claim 4, wherein said layer thicknesses in said SLS are in the range of about 30-500 Å.

7. A semiconductor electro-optical device of claim 4, wherein the thicknesses of each of said layers are sufficiently small that a quantum well effect occurs in said layers of the SLS, said effect increasing the bandgap of said first layers, thereby partially offsetting the effect of said lattice mismatch strain, and wherein the thicknesses of said first set of layers are selected sufficiently large to minimize said quantum well effect while still being sufficiently small to provide a SLS at said thickness ratio.

8. A semiconductor electro-optical device of claim 7, wherein said layer thicknesses in said SLS are in the range of about 30-500 Å.

9. A semiconductor electro-optical device of claim 7, wherein said layer thicknesses in said SLS are in the range of about 50-300 Å.

10. A semiconductor electro-optical device of claim 2, wherein said response at 12 μm occurs at a device temperature of about 77° K.

11. A semiconductor electro-optical device of claim 9, wherein said ratio of layer thicknesses in said SLS is about 1.0.

12. An intrinsic semiconductor electro-optical device comprising a pair of spaced electrodes operably connected to a p-n junction intrinsically responsive, when cooled, to electromagnetic radiation in the wavelength range of 8-12 μm and which consists of semiconductor materials of the III-V family, wherein said radiation responsive p-n junction comprises a strained-layer superlattice (SLS) of alternating layers of two different III-V semiconductors, said two semiconductors when in bulk form having mismatched lattice constants, whereby a total strain is imposed on each pair of alternating semiconductor layers in said SLS structure, the proportion of the total strain which acts on each layer of said pair being inversely proportional to the ratio of the layer thicknesses of each layer in the pair, a first of said alternating III-V semiconductor layers being $In_{1-x}Ga_xAs_{1-y}Sb_y$ wherein each of x and y is a number such that the bulk bandgap of the resultant layer is approximately the minimum bandgap of the $In_{1-x}Ga_xAs_{1-y}Sb_y$ family, and the second of said alternating layers comprising a III-V semiconductor having a lattice constant larger than the lattice constant of said first layers, the strain resulting from the mismatch of lattice constants and said ratio of layer thicknesses being effective to narrow the bandgaps of said first of III-V layers, thereby changing the intrinsic radiation absorportion characteristics of said layers, when cooled, to include wavelengths in the 8-12 μm region which are larger than those to which said individual layers would be responsive, when cooled and in bulk form.

* * * * *